(12) United States Patent
Jaffee et al.

(10) Patent No.: US 7,535,976 B2
(45) Date of Patent: May 19, 2009

(54) APPARATUS AND METHOD FOR INTEGRATION OF TUNER FUNCTIONS IN A DIGITAL RECEIVER

(75) Inventors: Steven Jaffee, Irvine, CA (US); Donald McMullin, Laguna Hills, CA (US); Ramon Gomez, San Juan Capistrano, CA (US)

(73) Assignee: Broadcom Corporation, Irvine, CA (US)

( * ) Notice: Subject to any disclaimer, the term of this patent is extended or adjusted under 35 U.S.C. 154(b) by 631 days.

(21) Appl. No.: 10/902,477

(22) Filed: Jul. 30, 2004

(65) Prior Publication Data

US 2006/0023813 A1 Feb. 2, 2006

(51) Int. Cl.
*H03D 3/18* (2006.01)

(52) U.S. Cl. .................. 375/327; 375/261; 375/326; 375/340; 375/344; 329/302; 329/307; 329/324; 329/325; 329/359; 455/190.1

(58) Field of Classification Search .................. 375/261, 375/322, 324, 326, 327, 340, 344; 329/302, 329/306, 307, 323–325, 346, 358–360; 455/131, 455/190.1, 192.1

See application file for complete search history.

(56) References Cited

U.S. PATENT DOCUMENTS

| | | | |
|---|---|---|---|
| 3,872,329 A | 3/1975 | Dodson, III | |
| 4,331,944 A | 5/1982 | Lee | |
| 4,354,250 A | 10/1982 | Lee | |
| 4,849,661 A | 7/1989 | Bazes | |
| 5,210,504 A | 5/1993 | Yagita et al. | |
| 5,303,258 A | 4/1994 | Nakamura | |
| 5,303,412 A | 4/1994 | Kushner | |
| 5,325,401 A * | 6/1994 | Halik et al. ................. 375/329 |
| 5,493,710 A | 2/1996 | Takahara et al. | |
| 5,604,501 A | 2/1997 | McPartland | |
| 5,757,921 A | 5/1998 | Okanobu et al. | |
| 5,819,157 A | 10/1998 | Ben-Efraim et al. | |
| 5,859,559 A | 1/1999 | Hong et al. | |
| 5,859,570 A | 1/1999 | Itoh et al. | |
| 5,884,154 A | 3/1999 | Sano et al. | |
| 5,930,696 A | 7/1999 | Tzuang et al. | |

(Continued)

FOREIGN PATENT DOCUMENTS

DE 199 24 039 A1 12/1999

(Continued)

OTHER PUBLICATIONS

International Search Report for Appln. No. PCT/US01/44321, issued Oct. 30, 2002, 7 pages.

(Continued)

*Primary Examiner*—Dac V Ha
(74) *Attorney, Agent, or Firm*—Sterne, Kessler, Goldstein & Fox P.L.L.C.

(57) ABSTRACT

A receiver to process a RF input signal having a plurality of channels includes a direct down conversion circuit, a demodulation circuit, and a local oscillator circuit. The direct down conversion circuit provides a downconverted signal based on the RF input signal and a local oscillator signal. The demodulation circuit receives the downconverted signal and provides a demodulated signal. The local oscillator circuit sets a frequency of the local oscillator signal based on a selected channel of the plurality of channels.

26 Claims, 13 Drawing Sheets

U.S. PATENT DOCUMENTS

| | | | |
|---|---|---|---|
| 5,942,935 A | 8/1999 | Okanobu | |
| 5,950,112 A | 9/1999 | Hori et al. | |
| 5,991,612 A | 11/1999 | Saito | |
| 6,031,878 A | 2/2000 | Tomasz et al. | |
| 6,037,825 A | 3/2000 | Kung | |
| 6,069,510 A | 5/2000 | Keeth | |
| 6,075,829 A * | 6/2000 | Hayashi et al. | 375/344 |
| 6,122,497 A | 9/2000 | Gilbert | |
| 6,150,875 A | 11/2000 | Tsinker | |
| 6,160,571 A | 12/2000 | Wang | |
| 6,166,591 A | 12/2000 | Schultz et al. | |
| 6,218,885 B1 | 4/2001 | Ellis | |
| 6,246,864 B1 | 6/2001 | Koike | |
| 6,259,895 B1 * | 7/2001 | Yoshikawa et al. | 455/73 |
| 6,334,051 B1 * | 12/2001 | Tsurumi et al. | 455/324 |
| 6,347,126 B1 | 2/2002 | Nagayasu et al. | |
| 6,512,801 B1 | 1/2003 | Ninomiya | |
| 6,529,100 B1 | 3/2003 | Okanobu | |
| 6,529,721 B1 | 3/2003 | Tiller | |
| 6,563,383 B1 | 5/2003 | Otaka et al. | |
| 6,564,045 B1 | 5/2003 | Fransis | |
| 6,583,661 B1 | 6/2003 | Tanji et al. | |
| 6,631,257 B1 | 10/2003 | White et al. | |
| 6,693,980 B1 | 2/2004 | Linder et al. | |
| 6,720,839 B1 | 4/2004 | Torre et al. | |
| 6,731,712 B1 | 5/2004 | Lindstrom et al. | |
| 6,737,999 B2 | 5/2004 | Schreier | |
| 6,801,585 B1 | 10/2004 | Nguyen et al. | |
| 6,807,406 B1 | 10/2004 | Razavi et al. | |
| 6,956,812 B2 * | 10/2005 | Okada et al. | 370/208 |
| 7,010,059 B2 * | 3/2006 | Song et al. | 375/316 |
| 7,154,346 B2 | 12/2006 | Jaffe et al. | |
| 2002/0039052 A1 | 4/2002 | Straub et al. | |
| 2002/0042255 A1 | 4/2002 | Prentice | |
| 2002/0120937 A1 | 8/2002 | Chang | |
| 2002/0190783 A1 | 12/2002 | Duncan et al. | |
| 2003/0045263 A1 | 3/2003 | Wakayama et al. | |
| 2003/0143960 A1 | 7/2003 | Yamawaki et al. | |
| 2007/0026831 A1 | 2/2007 | Jaffe et al. | |

FOREIGN PATENT DOCUMENTS

| | | |
|---|---|---|
| GB | 2 339 351 | 1/2000 |
| WO | WO 00/13306 | 3/2000 |

OTHER PUBLICATIONS

Written Opinion from PCT Application No. PCT/US01/44321, filed Nov. 29, 2001, 6 pages (mailing date of written opinion—Jul. 23, 2003).

Sedra, et al., "MicroElectronic Circuits," CBS College Publishing, New York, New York, 1987, pp. 96-100 and 805.

U.S. Appl. No. 10/902,465, filed Jul. 30, 2004, Jaffe et al., Apparatus and Method to Provide a Local Oscillator Signal.

* cited by examiner

APPARATUS AND METHOD FOR INTEGRATION OF TUNER FUNCTIONS IN A DIGITAL RECEIVER

BACKGROUND OF THE INVENTION

1. Field of the Invention

The present invention generally relates to digital receivers, and more specifically to digital receivers capable of processing both analog and digital signals.

2. Background Art

Television signals are transmitted at radio frequencies (RF) using terrestrial, cable, or satellite transmission schemes. Terrestrial and cable TV signals are typically transmitted at frequencies of approximately 57 to 860 MHZ, with 6 MHZ channel spacing in the United States and 8 MHz channel spacing in Europe. Satellite TV signals are typically transmitted at frequencies of approximately 980 to 2180 MHz.

Regardless of the transmission scheme, a tuner is utilized to select and down-convert a desired channel from the TV signal to an intermediate frequency (IF) signal or a baseband signal, which is suitable for processing and display on a TV or computer screen. The tuner should provide sufficient image rejection and channel selection during down-conversion as is necessary for the specific application. The National Television Standards Committee (NTSC) sets standards for television signal transmission, reception, and display. To process a NTSC signal, it is preferable that the tuner have a high-level of image rejection. However, less image rejection is acceptable for non-NTSC signals depending on the specific application and the corresponding display requirements.

After the tuner down-converts the desired channel from the TV signal, the resulting IF or baseband signal is typically converted into a digital signal to be processed by a digital receiver. However, placing an analog signal, such as the desired channel from the TV signal, in close proximity with a digital signal can cause interference between the signals. Thus, the tuner circuitry and the digital receiver circuitry are often separated in traditional communication systems.

Separating the tuner circuitry and the digital receiver circuitry has several disadvantages. For example, more circuit area is needed for separate tuner and digital circuits, which leads to higher cost.

What is needed is a method or apparatus for integrating tuner functions in a digital receiver.

BRIEF SUMMARY OF THE INVENTION

The present invention is an apparatus and method for integration of tuner functions in a digital receiver. For example, a receiver includes a direct down conversion circuit, a demodulation circuit, and a local oscillator circuit. The receiver receives a RF input signal having a plurality of channels. The receiver down-converts a selected channel of the plurality of channels to provide a baseband signal or an IF signal.

According to an embodiment, the direct down conversion circuit includes mixers and a low pass filter coupled to the output of the mixers. The direct down conversion circuit provides a downconverted signal based on the RF input signal and a local oscillator (LO) signal. The RF input signal can include first and second quadrature components, and/or the LO signal can include first and second LO quadrature components.

If both the RF input signal and the LO signal include quadrature components, then four mixers are generally used for downconversion. If either the RF input signal or the LO signal includes quadrature components, then two mixers are generally used for downconversion. For example, during operation of the direct down conversion circuit in the latter scenario, the first mixer can combine the RF input signal and the first LO quadrature component to provide a first downconverted quadrature component. The second mixer can combine the RF input signal and the second LO quadrature component to provide a second downconverted quadrature component. In another example, the first mixer can combine a first quadrature component of the RF input signal and the LO signal. The second mixer can combine a second quadrature component of the RF input signal and the LO signal.

The first and second downconverted quadrature components are multiplexed and passed through at least one analog-to-digital converter to provide a digital signal. The digital signal passes through a demultiplexer and is provided to the demodulation circuit. The demodulation circuit provides a demodulated signal to the local oscillator circuit. The local oscillator circuit sets a frequency of the local oscillator signal based on a selected channel of the plurality of channels. At least one digital-to-analog converter (DAC) receives a digital representation of the local oscillator signal from the local oscillator circuit and converts the digital representation into an analog local oscillator signal. A narrow band filter provides the local oscillator signal to the direct down conversion circuit.

BRIEF DESCRIPTION OF THE DRAWINGS

The present invention is described with reference to the accompanying drawings. In the drawings, like reference numbers indicate identical or functionally similar elements. Additionally, the left-most digit(s) of a reference number identifies the drawing in which the reference number first appears.

DETAILED DESCRIPTION OF THE INVENTION

Figure 1:
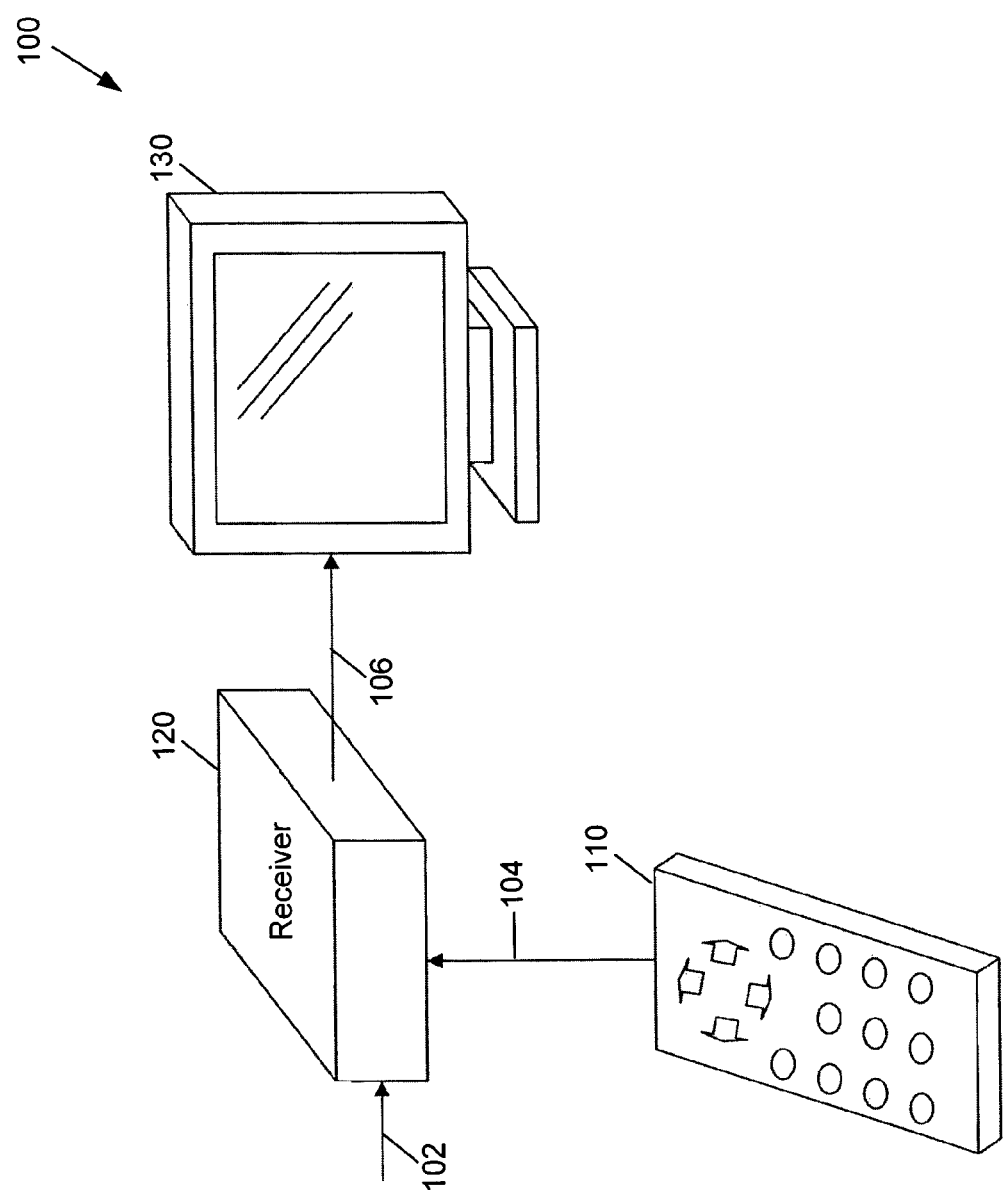
FIG. 1 illustrates a communication system according to an embodiment of the present invention.

FIG. 1 illustrates a communication system according to an embodiment of the present invention. The communication system 100 includes a channel selector 110, a receiver 120, and a display device 130. For example, a user selects a desired channel using the channel selector 110. The channel selector 110 transmits a signal 104 including information associated with the desired channel to the receiver 120. In an embodiment, the channel selector 110 transmits an infrared signal indicating the desired channel to the receiver 120. It is understood in the art that the channel selector 110 is physically coupled to the receiver 120 in some embodiments.

The receiver 120 receives a radio frequency (RF) input signal 102 and the signal 104 from the channel selector 110. The RF input signal 102 typically includes multiple channels. The receiver 120 uses the signal 104 from the channel selector 110 to determine which of the channels of the RF input signal 102 to transmit to the display device 130.

The display device 130 can be a cathode ray tube (CRT) display device, a liquid crystal display (LCD) device, a plasma display device, or an image projection device, to provide some examples. The display device 130 provides a pictorial representation of the selected channel. In an embodiment, the display device 130 is capable of accepting a signal having a higher resolution than a standard National Television Standards Committee (NTSC) signal. For example, the display device 130 can be capable of accepting an enhanced-definition television (EVTV) signal or a high-definition television (HDTV) signal.

Figure 2:
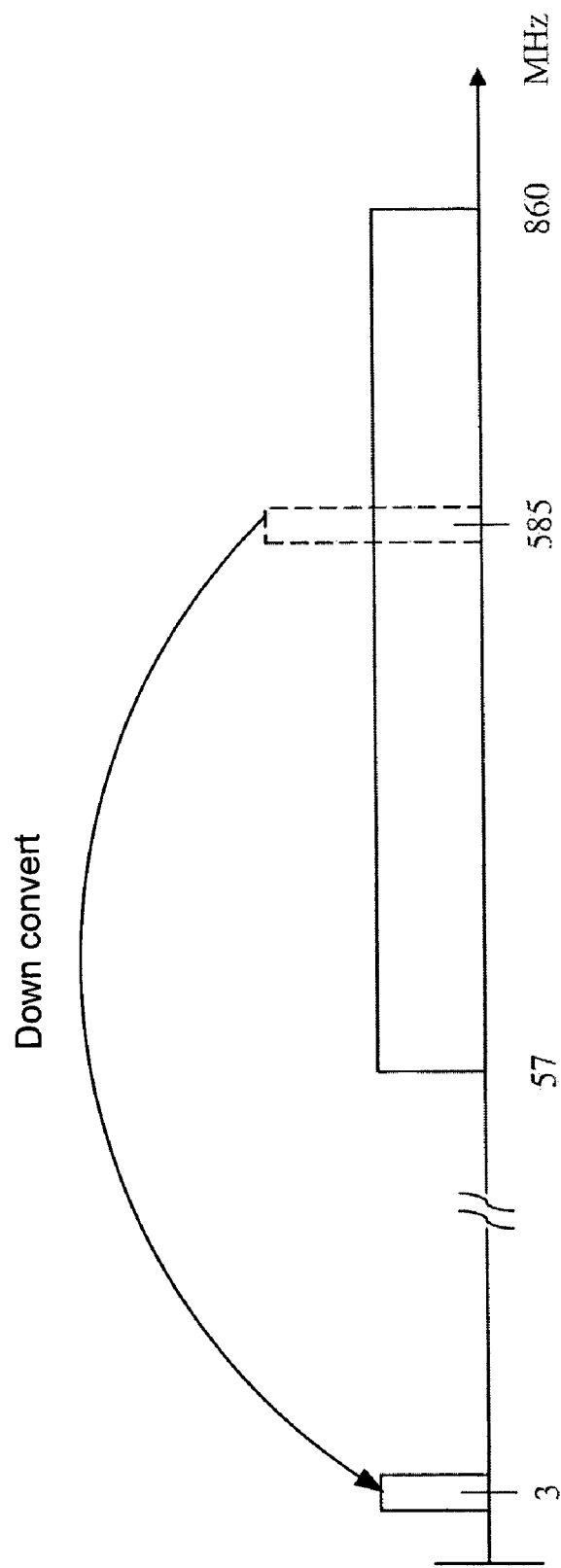
FIG. 2 illustrates channel selection of the receiver according to an embodiment of the present invention.

The operation of the receiver 120 is described as follows and in reference to FIG. 2, where FIG. 2 represents the frequency spectrum of the particular signals that are received and/or generated by the receiver 120. As shown in FIG. 2, in one embodiment, the RF input signal 102 can include channels within a frequency range from 57 to 860 MHz. For example, the RF input signal 102 can be a cable television signal having a channel spacing of 6 or 8 MHz, although the scope of the present invention is not limited in this respect. As shown in FIG. 2, a channel at 585 MHz can be selected as an example. Upon selection of the channel, the RF input signal 102 is generally downconverted to provide an IF signal or a baseband signal. For example, the 585 MHz channel can be downconverted to facilitate processing of the channel prior to its display. As shown in FIG. 2, the 585 MHz channel can be downconverted to 3 or 4 MHz in an embodiment.

The downconverted signal is typically generated by combining a local oscillator signal and the selected channel of the RF input signal 102 in a receiver 120. For example, a mixer can provide a downconverted signal having a frequency based on the frequency of the local oscillator signal. In a first embodiment, the local oscillator signal is a quadrature signal having first and second LO quadrature components. Generally, quadrature components are substantially the same in amplitude and frequency; however, the two components are typically 90° out of phase with each other. In a second embodiment, the RF input signal is a quadrature signal having first and second RF quadrature components. In a third embodiment, the local oscillator signal and the RF input signal each have quadrature components.

With respect to the third embodiment, each of the RF quadrature components can be combined with each of the LO quadrature components. The LO quadrature components can be referred to as $LO_i$ and $LO_q$. The RF quadrature components can be referred to as $RF_i$ and $RF_q$. For example, mixing the RF quadrature components and the LO quadrature components can provide quadrature signals defined by the following equations:

$$IF_i = LO_i * RF_i + LO_q * RF_q$$

$$IF_q = LO_i * RF_q - LO_q * RF_i.$$

To simplify the discussion, the first embodiment is described with reference to FIGS. 3-5, which provide some examples of receivers that utilize a local oscillator having first and second quadrature components to provide the downconverted signal, according to embodiments of the present invention.

Figure 3:
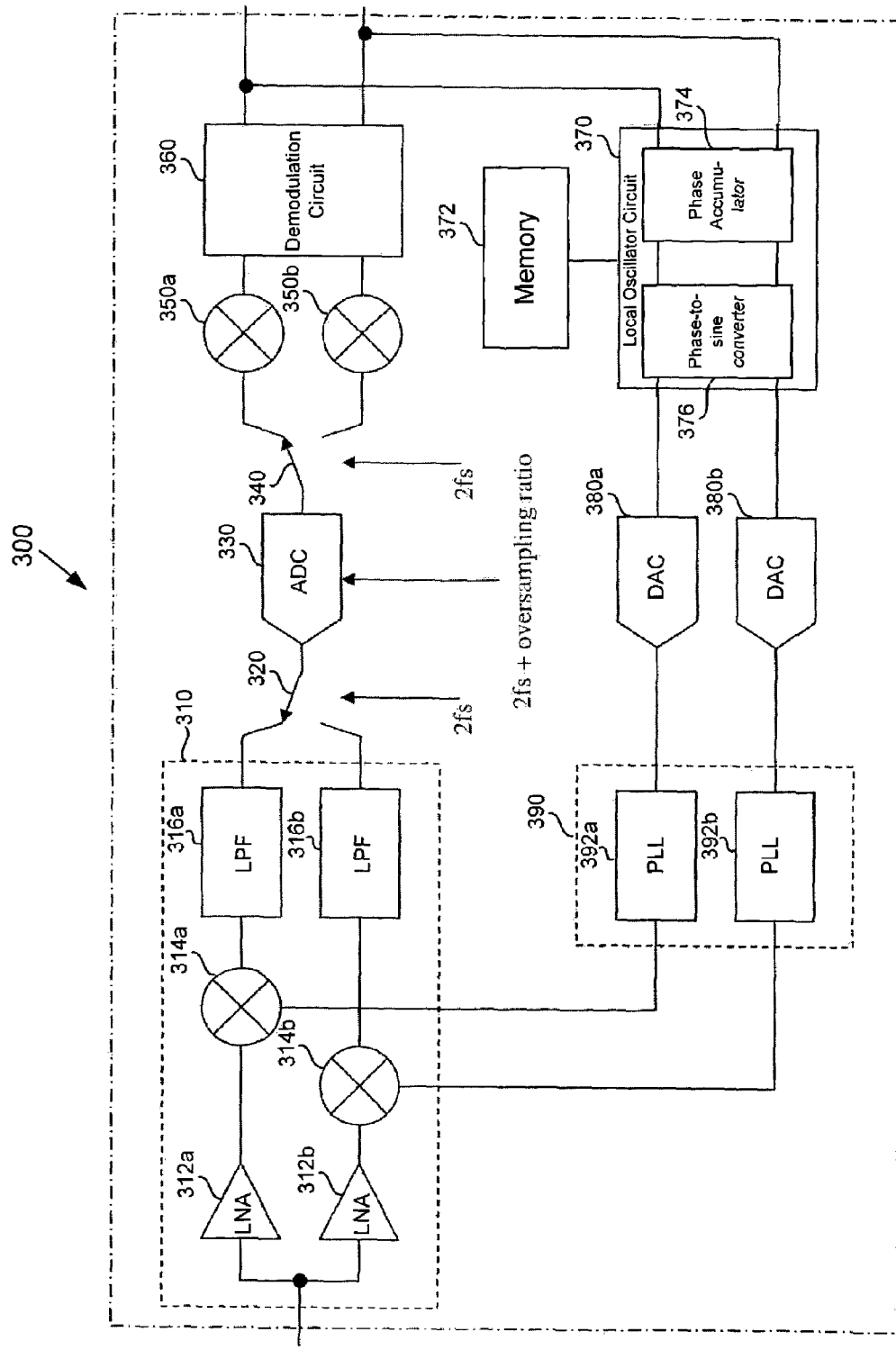
FIG. 3 illustrates a receiver in which quadrature components of a local oscillator signal are independently generated according to an embodiment of the present invention.

FIG. 3 illustrates a receiver in which quadrature components of a local oscillator signal are independently generated according to an embodiment of the present invention. The receiver 300 includes a direct down conversion circuit 310, a demodulation circuit 360, and a local oscillator circuit 370. The direct down conversion circuit 310 receives a RF input signal 102. The RF input signal 102 is generally amplified by a low-noise amplifier 312 to amplify the RF input signal 102 to an amplitude above the noise floor of the receiver 300. According to an embodiment, the RF input signal 102 is amplified before being received by the direct down conversion circuit 310. For instance, a discrete low-noise amplifier, such as Broadcom part number BCM 3405, can be coupled to the input of the direct down conversion circuit 310. In an embodiment, the RF input signal 102 is amplified by the direct down conversion circuit 310. For example, low-noise amplifiers 312 can amplify the RF input signal 102 before the RF input signal 102 is passed to mixers 314.

The mixers 314 mix the RF input signal 102 and a local oscillator signal to provide a downconverted signal. As shown in FIG. 3, mixer 314a mixes the RF input signal 102 and a first quadrature component of the local oscillator signal to provide a first downconverted quadrature component. Mixer 314b mixes the RF input signal 102 and a second quadrature component of the local oscillator signal to provide a second downconverted quadrature component. For instance, the downconverted quadrature components can include unwanted adjacent channel energy. One or more low pass filters (LPFs) 316 can eliminate or reduce the unwanted energy.

A multiplexer 320 can be included to select the first downconverted quadrature component or the second downconverted quadrature component to be sent to at least one analog-to-digital converter (ADC) 330. In FIG. 3, the receiver 300 includes a single ADC 330 for illustrative purposes, though the scope of the present invention is not limited in this respect. For instance, a single ADC can be used to reduce gain and/or linearity mismatches between the quadrature components. In an embodiment, using a single ADC reduces the size of the receiver 300.

The multiplexer 320 can interleave samples of the first downconverted quadrature component and the second downconverted quadrature component to provide an interleaved sample of the downconverted quadrature components to the ADC 330. In one embodiment, the multiplexer 320 toggles at a rate equal to at least twice the effective sampling rate of the ADC 330. For example, sampling at this rate can facilitate accurate conversion of the downconverted quadrature components by the ADC 330.

The ADC 330 converts the interleaved sampling of the downconverted quadrature components into a digital signal. According to an embodiment, the sampling rate of the ADC 330 equals the interleaving rate of the multiplexer 320 plus an over sampling ratio. For instance, basing the sampling rate of the ADC 330 on the over sampling ratio can extend the noise performance of the ADC 330 and/or reduce the number of bits required by the ADC 330.

A demultiplexer 340 de-interleaves the digital samples of the downconverted quadrature components provided by the ADC 330. In an embodiment, the demultiplexer 340 toggles at a rate equal to the toggle rate of the multiplexer 320. The de-interleaved samples of the downconverted quadrature components can be frequency shifted or time shifted to restore quadrature alignment and/or quadrature time alignment, although the scope of the present invention is not limited in this respect. For example, mixers 350 can introduce a frequency offset to the de-interleaved samples of at least one of the downconverted quadrature components to provide frequency-corrected samples to the demodulation circuit 360.

The demodulation circuit 360 provides a demodulated signal to the local oscillator circuit 370. In an embodiment, the demodulation circuit 360 is a quadrature amplitude modulation (QAM) demodulation circuit. For example, the demodulation circuit 360 can include a Nyquist filter, a variable rate symbol demodulator, an equalizer, and a carrier recovery loop. According to an embodiment, QAM improves the data transmission rate of the receiver 300 without degrading the bit error rate (BER) of the receiver 300.

The local oscillator circuit 370 sets the frequency of the local oscillator signal based on the selected channel of the RF input signal 102. For example, the local oscillator circuit 370 can receive information regarding the desired channel from the channel selector 110 shown in FIG. 1 and set the frequency of the local oscillator signal based on that information.

Receivers typically include at least one voltage controlled oscillator (VCO) that generates a signal having a frequency based on the input voltage of the VCO. According to an embodiment, the local oscillator circuit 370 includes a VCO. For example, each of the channels of the RF input signal can be associated with a particular LO frequency needed to downconvert the selected channel. The VCO can receive an input voltage based on the desired channel and set the frequency of the local oscillator signal based on the input voltage.

The local oscillator circuit 370 digitally generates the local oscillator signal according to an embodiment. For instance, the local oscillator circuit 370 typically generates a digital representation of the local oscillator signal. The receiver 300 often includes a memory 372 to store a read-only memory (ROM) lookup table. The ROM lookup table can include a plurality of entries. According to a first embodiment, each entry represents a phase of the local oscillator signal or a sine or cosine thereof. The local oscillator circuit 370 can retrieve an entry from the ROM lookup table at each cycle or half-cycle of the VCO clock, for example, to provide the digital representation of the local oscillator signal.

According to another embodiment, the ROM lookup table stores an offset value. For example, the offset value can indicate a difference between the actual frequency of the local oscillator signal and the desired frequency of the local oscillator signal. The frequency of the local oscillator signal can be set based on the offset value. For instance, the offset value can be combined with the local oscillator signal to provide a frequency-shifted local oscillator signal.

In another example, the offset value can indicate a difference between the actual phase of the local oscillator signal and the desired phase of the local oscillator signal. The phase of the local oscillator signal can be set based on the offset value. For instance, the offset value can be combined with the local oscillator signal to provide a phase-shifted local oscillator signal. Basing the frequency or the phase of the local oscillator signal on the offset value can save time, as compared to accessing the ROM lookup table in successive cycles of the local oscillator circuit 370.

Digitally generating the local oscillator signal can enable a reduction in the number of VCOs needed in the receiver 300. For instance, a reduction in the number of VCOs can provide a reduction in the size of the receiver 300. Including fewer VCOs in the receiver 300 can result in a lower cost of the receiver 300.

According to an embodiment, the local oscillator circuit 370 is a direct digital frequency synthesizer (DDFS). The DDFS digitally converts phase information relating to the local oscillator signal to a digitized sinusoidal waveform. The DDFS can receive the phase information from the ROM lookup table or from the demodulated signal received from the demodulation circuit 360, to provide some examples. The DDFS can provide faster frequency switching, lower phase noise, and/or higher frequency resolution, as compared to standard phase-locked loop (PLL) frequency synthesizers.

The DDFS typically includes a phase accumulator 374 to receive phase information relating to the local oscillator signal with each successive clock cycle of the local oscillator circuit 370. For example, the phase accumulator 374 can receive first phase information during a first clock cycle, second phase information during a second clock cycle, and so on.

The DDFS can further include a phase-to-sine converter 376 to convert phase information received from the memory 372 into a digitized sinusoidal waveform. For example, the phase-to-sine converter 376 can provide a first waveform representing the sine of the phase information and a second waveform representing the cosine of the phase information. In an embodiment, the first waveform is a first quadrature component of the local oscillator signal, and the second waveform is a second quadrature component of the local oscillator signal.

The memory 372 typically stores information relating to time-independent variations between the quadrature components of the local oscillator signal. The DDFS generally monitors time-dependent variations between the quadrature components. For instance, the DDFS can monitor the quadrature components of the local oscillator signal in the analog domain. This can reduce the size and/or number of components needed in the receiver 300.

Quadrature components of the local oscillator signal can be generated independently in accordance with the embodiment shown in FIG. 3. According to an embodiment, the local oscillator circuit 370 reduces a gain mismatch or a phase mismatch between the quadrature components. For example, the local oscillator circuit 370 can access the ROM lookup table to determine a phase offset or a frequency offset to be applied to one of the quadrature components.

The offset value stored in the ROM lookup table can indicate a phase difference between quadrature components of the local oscillator signal, for example. The offset value can be used to adjust the phase of at least one of the quadrature components of the local oscillator signal. Utilizing the offset value to correct the phase difference between the quadrature components of the local oscillator signal can eliminate the need for other quadrature correcting circuitry or software. For example, correcting the quadrature of the local oscillator signal using the local oscillator circuit 370 can reduce the number of components needed in the receiver 300, thereby reducing the cost of the receiver in an embodiment.

The frequency of the local oscillator signal can be based on a frequency control word associated with the local oscillator signal. For instance, a clock signal can be multiplied by the frequency control word to calculate the frequency of the local oscillator signal. The offset value stored in the ROM lookup table can be used to calculate the frequency control word associated with the local oscillator signal. In an embodiment, the offset value is used to set the frequency of at least one of the quadrature components of the local oscillator signal.

According to an embodiment, the receiver 300 includes two DDFSs. For instance, a first DDFS can be used to convert phase information relating to a first quadrature component of the local oscillator signal to a first digitized sinusoidal waveform. The second DDFS can be used to convert phase information relating to a second quadrature component of the local oscillator signal to a second digitized sinusoidal waveform.

As shown in FIG. 3, digital representations of the local oscillator quadrature components are provided to digital-to-analog converters (DACs) 380. The DACs 380 can convert the digital representations into analog local oscillator signals. For instance, the DACs 380 can directly generate the analog local oscillator signals. Alternatively, the DACs 380 can generate reference signals, which can be used by phase-locked loops (PLLs), such as PLLs 392, to generate the analog local oscillator signals. According to an embodiment, the DACs 380 reduce jitter of the analog local oscillator signals.

Passing the local oscillator signal through a filter 390 can eliminate or reduce energy at frequencies outside the passband of the filter 390. The filter 390 can be a low pass filter or a bandpass filter, to provide some examples. According to an embodiment, the filter 390 is a narrow-band filter. In FIG. 3, the filter 390 can be set at a particular frequency or range of frequencies that represents the desired channel of the RF input signal. In a first embodiment, the passband of the filter 390 is set based on the frequency of the local oscillator signal set by the local oscillator circuit 370. In a second embodiment, the passband of the filter 390 is set at a predetermined frequency or range of frequencies, and the local oscillator circuit 370 manipulates the frequency of the local oscillator signal to be within the passband of the filter 390. For example, the local oscillator circuit 370 can multiply the frequency of the local oscillator signal by a factor based on the selected channel of the RF input signal 102.

The filter 390 generally includes at least one phase-locked loop (PLL) 392. The PLLs 392 can provide the quadrature components of the local oscillator signal to the direct down conversion circuit 310 to be mixed with the RF input signal 102. As shown in FIG. 3, a PLL 392 can be included for each quadrature component of the local oscillator signal. However, a single PLL can be used to filter both quadrature components.

The PLL 392 often manipulates the frequency of the local oscillator signal by a predetermined factor. According to an embodiment, the PLL 392 multiplies the frequency of the local oscillator signal by a factor in a range from approximately two to approximately thirty. The PLL 392 can increase the frequency of the local oscillator signal by a factor of six in a cable modem system, for example. The PLL 392 can increase the frequency of the local oscillator signal by a factor of twelve in a satellite communication system, to provide another example.

Using the PLL 392 to multiply the frequency of the local oscillator signal by a fixed value can allow the DAC 380 to sample at a lower rate. For example, the sampling rate of the DAC 380 is decreased by a factor that is proportional to the factor by which the frequency of the local oscillator is multiplied in an embodiment. Using the PLL 392 to multiply the frequency of the local oscillator signal by a fixed value can enable the size of the PLL 392 to be reduced, as compared to the situation in which the PLL 392 is used to multiply the frequency of the local oscillator by a variable factor to generate the frequency of the local oscillator signal.

According to an embodiment of the present invention, the direct down conversion circuit 310, the demodulation circuit 360, and the local oscillator circuit 370 are on a common substrate. One or more of the multiplexer 320, the ADC 330, the demultiplexer 340, the DAC 380, and the filter 390 can be on the common substrate, as well. Combining elements, such as those mentioned above, on a common substrate can reduce the cumulative circuit area required by the elements. Reducing the circuit area reduces the cost of the elements in an embodiment.

Figure 4:
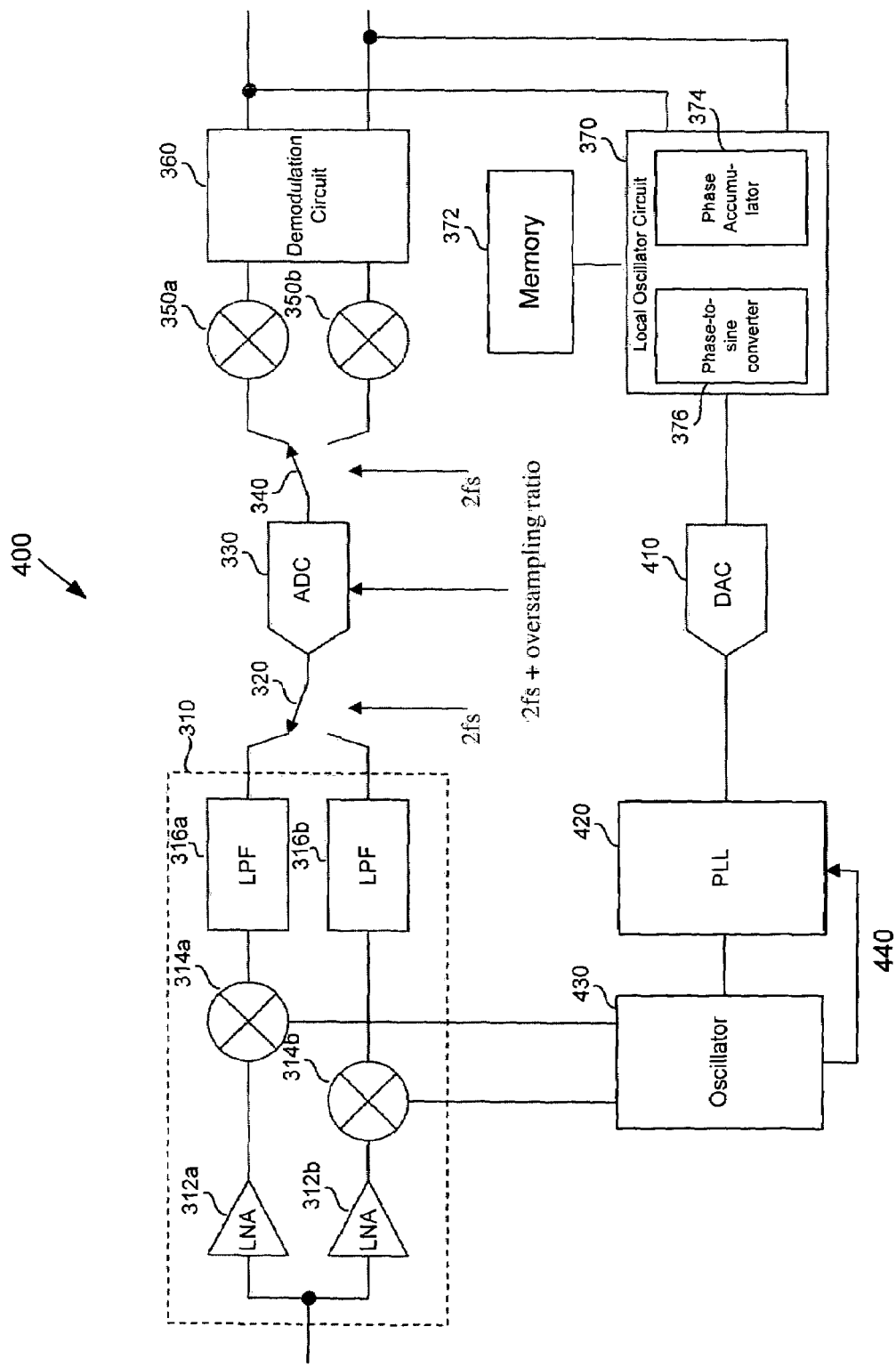
FIG. 4 illustrates a receiver in which quadrature components of a local oscillator signal are generated using an oscillator according to an embodiment of the present invention.

FIG. 4 illustrates a receiver in which quadrature components of a local oscillator signal are generated using an oscillator according to an embodiment of the present invention. For example, the local oscillator circuit 370 can provide a digital representation of a local oscillator signal that does not include quadrature components. The digital representation can be received by a single DAC 410, as shown in FIG. 4, though the scope of the invention is not limited in this respect. The DAC 410 converts the digital representation of the local oscillator signal to an analog reference signal. The reference signal often includes quantization noise and/or images, which can be related to the finite sampling rate of the DAC 410, for example. The PLL 420 can filter the reference signal to reduce or eliminate the quantization noise and/or images. The PLL 420 generates the local oscillator signal based on the reference signal. The oscillator 430 generates quadrature components of the local oscillator signal to be provided to the direct down conversion circuit 310. According to an embodiment, the PLL 420 includes the oscillator 430. For instance, the oscillator 430 can be embedded in the PLL 420.

The receiver 400 can include feedback 440 between the oscillator 430 and the PLL 420. For example, the PLL 420 can use information received from the oscillator 430 via the feedback 440 to increase the frequency of the local oscillator signal. According to an embodiment, the PLL 420 generates the local oscillator signal having a frequency that is based on the reference signal and the information received from the oscillator 430 via the feedback 440.

The oscillator 430 can be one or more ring oscillators or inductor-capacitor (LC) oscillators, to provide some examples. A ring oscillator generally has a greater bandwidth than a single LC oscillator and requires less circuit area than multiple LC oscillators. A ring oscillator typically includes a plurality of inverters. For example, the ring oscillator can include n inverters. Each inverter can have an input and an output. The inverters can be coupled, such that the output of a first inverter is coupled to the input of a second inverter, and the output of the second inverter is coupled to the input of a third inverter, etc. For instance, the output of the nth inverter can be coupled to the input of the first inverter. In an embodiment, the first mixer 314a of the direct down conversion circuit 310 is coupled to a particular inverter. The second mixer 314b can be coupled to another inverter to enable the signal received by the first mixer 314a to be 90° out of phase with the signal received by the second mixer 314b.

An image filter can be coupled between the oscillator 430 and the direct down conversion circuit 310. For instance, the image filter can filter the quadrature components of the local oscillator signal before passing the quadrature components of the local oscillator signal to the mixers 314. The DAC 410, the PLL 420, the oscillator 430, and/or the image filter can be disposed on a common substrate with the direct down conversion circuit 310, the demodulation circuit 360, and the local oscillator circuit 370.

Figure 5:
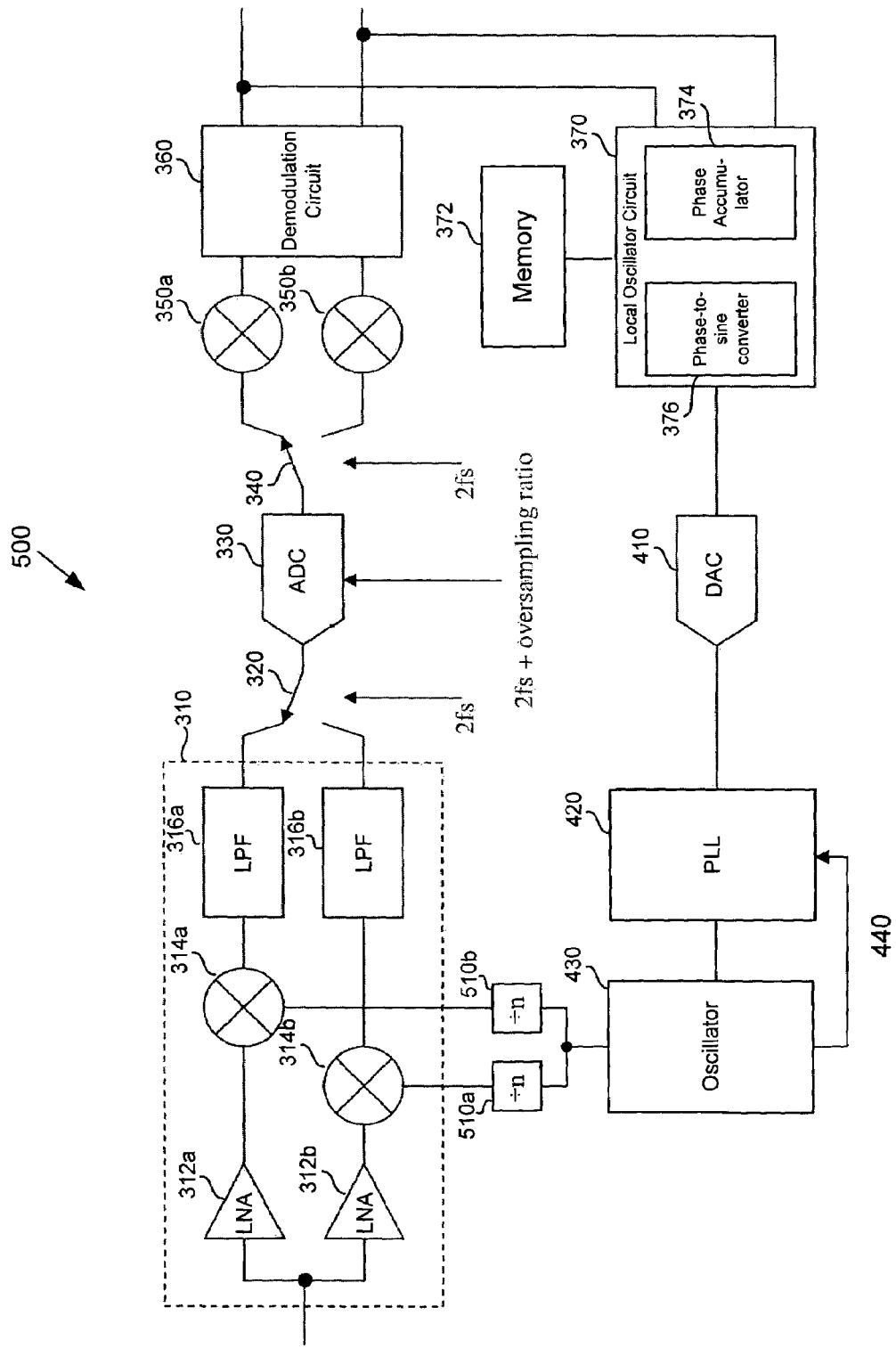
FIG. 5 illustrates a receiver in which quadrature components of a local oscillator signal are generated using dividers according to an embodiment of the present invention.

FIG. 5 illustrates a receiver in which quadrature components of a local oscillator signal are generated using dividers according to an embodiment of the present invention. The oscillator 430 can oscillate at a frequency that is a multiple of the local oscillator (LO) signal frequency. The dividers 510 can divide the frequency of the signal provided by the oscillator 430 by a factor to provide the LO quadrature components at a particular frequency.

For example, the oscillator 430 can oscillate at a frequency twelve times the LO signal frequency. The dividers 510 can be divide-by-two dividers. In this example, the divide-by-two dividers can divide the frequency of the signal that is provided by the oscillator 430 by two to provide quadrature components having a frequency of six times the LO signal frequency.

The dividers 510 can be initialized one-half of an input cycle apart, for example. The dividers 510 can be triggered on alternating edges of the signal provided by the oscillator 430. The first divider 510*a* can be triggered on a rising edge of the signal provided by the oscillator 430, and the second divider 510 can be triggered on a falling edge of the signal, or vice versa. The resulting LO quadrature components are typically 90° out of phase with each other. The oscillator 430 can be a differential oscillator to provide a signal having symmetrical rising and falling edges.

According to an embodiment, the dividers 510 are coupled between the PLL 420 and the oscillator 430. For example, the dividers 510 can reduce the frequency of the signal provided by the PLL 420 before passing the signal to the oscillator 430. In an embodiment, a single divider is coupled between the PLL 420 and the oscillator 430.

Figure 6:
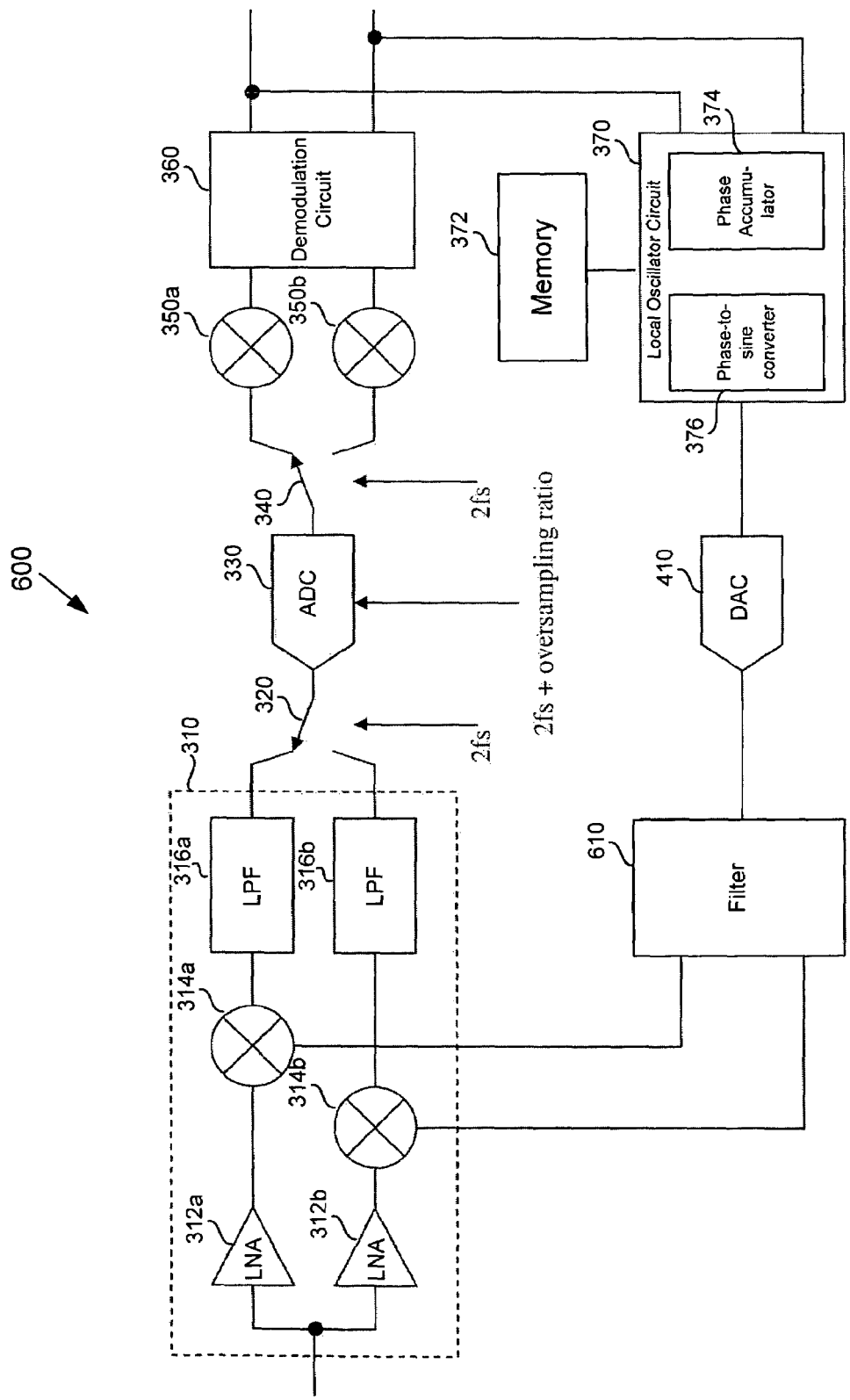
FIG. 6 illustrates a receiver in which quadrature components of a local oscillator signal are generated using a filter according to an embodiment of the present invention.

FIG. 6 illustrates a receiver in which quadrature components of a local oscillator signal are generated using a filter according to an embodiment of the present invention. The filter 610 generally removes jitter from the local oscillator signal. The filter 610 can be capable of accommodating a range of local oscillator frequencies.

The filter 610 can be an image filter. The filter 610 can be a low pass filter or a bandpass filter, to provide some examples. In an embodiment, the filter 610 is a poly-phase filter. The poly-phase filter generally includes a capacitor-resistor (CR) high pass filter portion and a resistor-capacitor (RC) low pass filter portion. LO quadrature components can be provided respectively by the two filter portions. At the 3 dB point, for example, the magnitude of the LO quadrature components is approximately the same, and phase of the two components differs by approximately 90°. The filter 610 can be adjustable to accommodate particular local oscillator frequencies. For instance, the frequency response of the filter 620 can be digitally programmed to accommodate a range of local oscillator frequencies.

Figure 7:
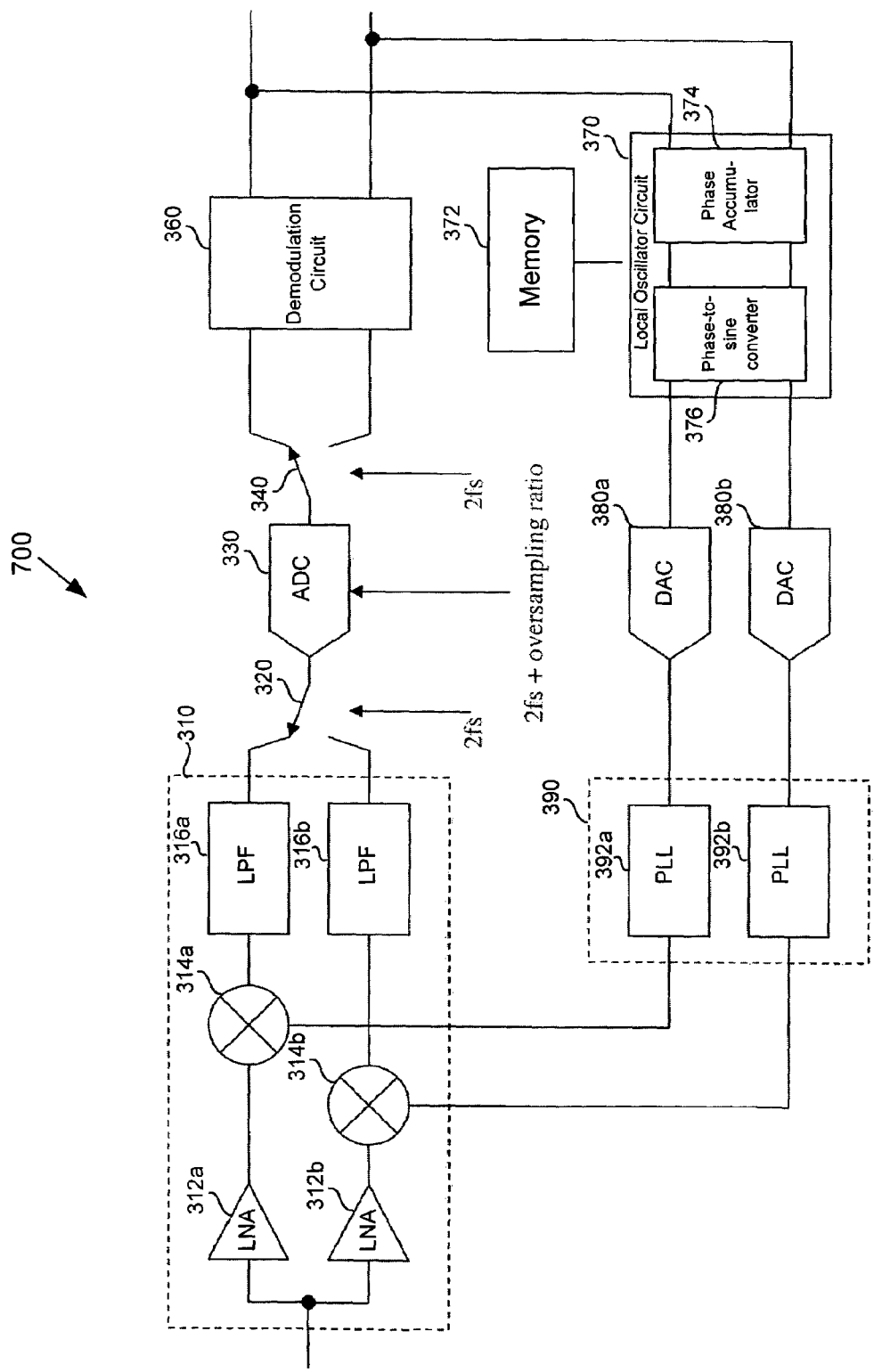
FIG. 7 illustrates a receiver in which mixers are not needed in the digital domain according to an embodiment of the present invention.

Referring to FIG. 7, mixers 350 as shown in FIGS. 3-6 are not necessarily needed according to an embodiment of the present invention. For instance, the local oscillator circuit 370 can set the frequency of the local oscillator sufficiently, so that a frequency offset need not be provided to the downconverted signal. In another example, the local oscillator circuit 370 and/or the ADC 330 reduce a gain mismatch or a linearity mismatch between quadrature components to a degree that mixers in the digital domain of the receiver 300, 400, 500, or 600 are not necessary to adjust the frequency difference between quadrature components.

Figure 8:
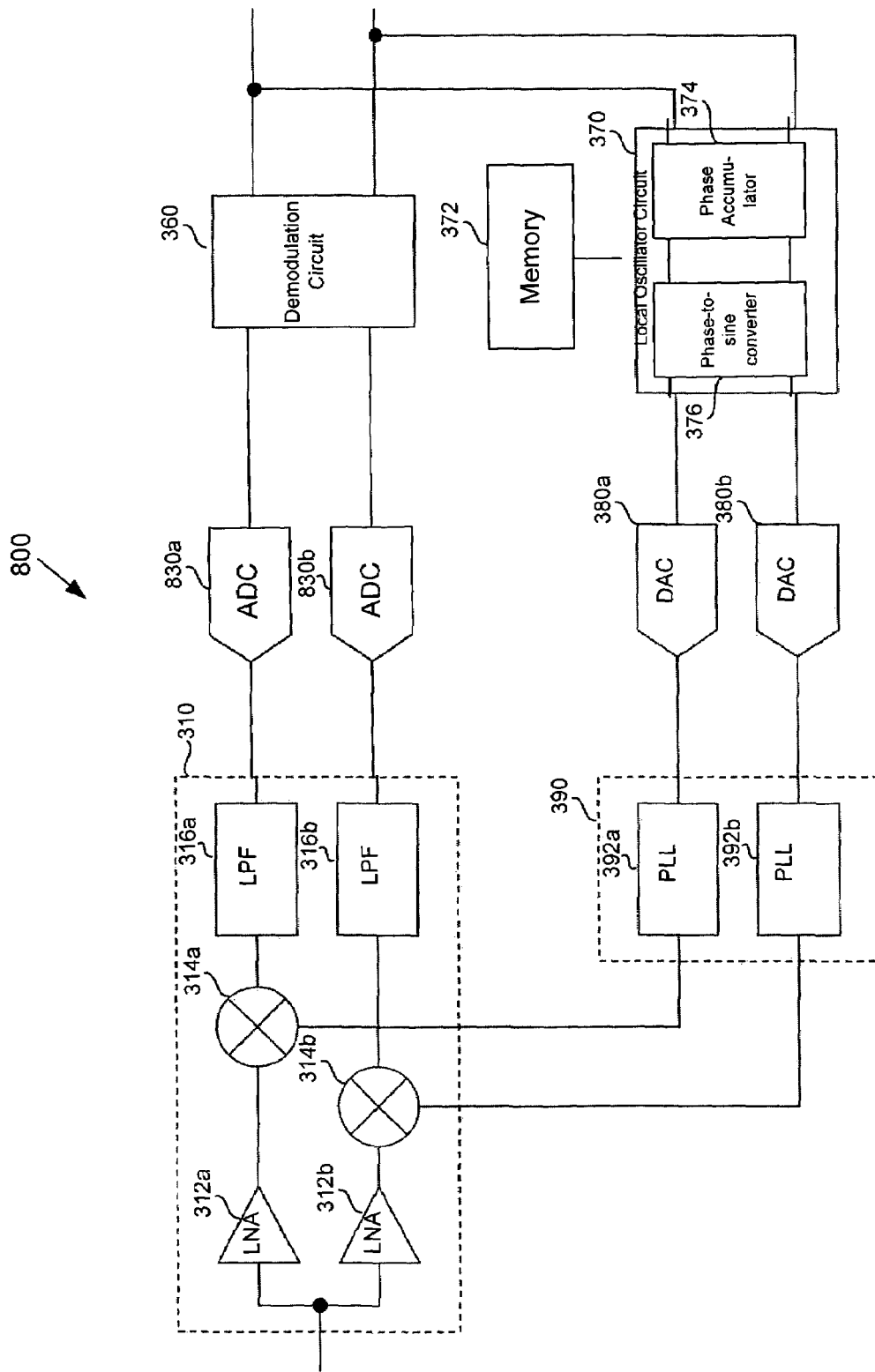
FIG. 8 illustrates a receiver having multiple analog-to-digital converters (ADCs) according to an embodiment of the present invention.

Although the receivers 300, 400, 500, 600, and 700 of FIGS. 3-7, respectively, include a single ADC 330 for illustrative purposes, the scope of the present invention is not limited in this respect. Referring to FIG. 8, multiple ADCs 830 can be used to convert the downconverted quadrature components into digital signals. For instance, a first ADC 830*a* can convert the first quadrature component into a first digital signal, and a second ADC 830*b* can convert the second quadrature component into a second digital signal. Using a different ADC 830 for each downconverted quadrature component eliminates the need to have the multiplexer 320 and the demultiplexer 340, according to an embodiment.

Figure 9:
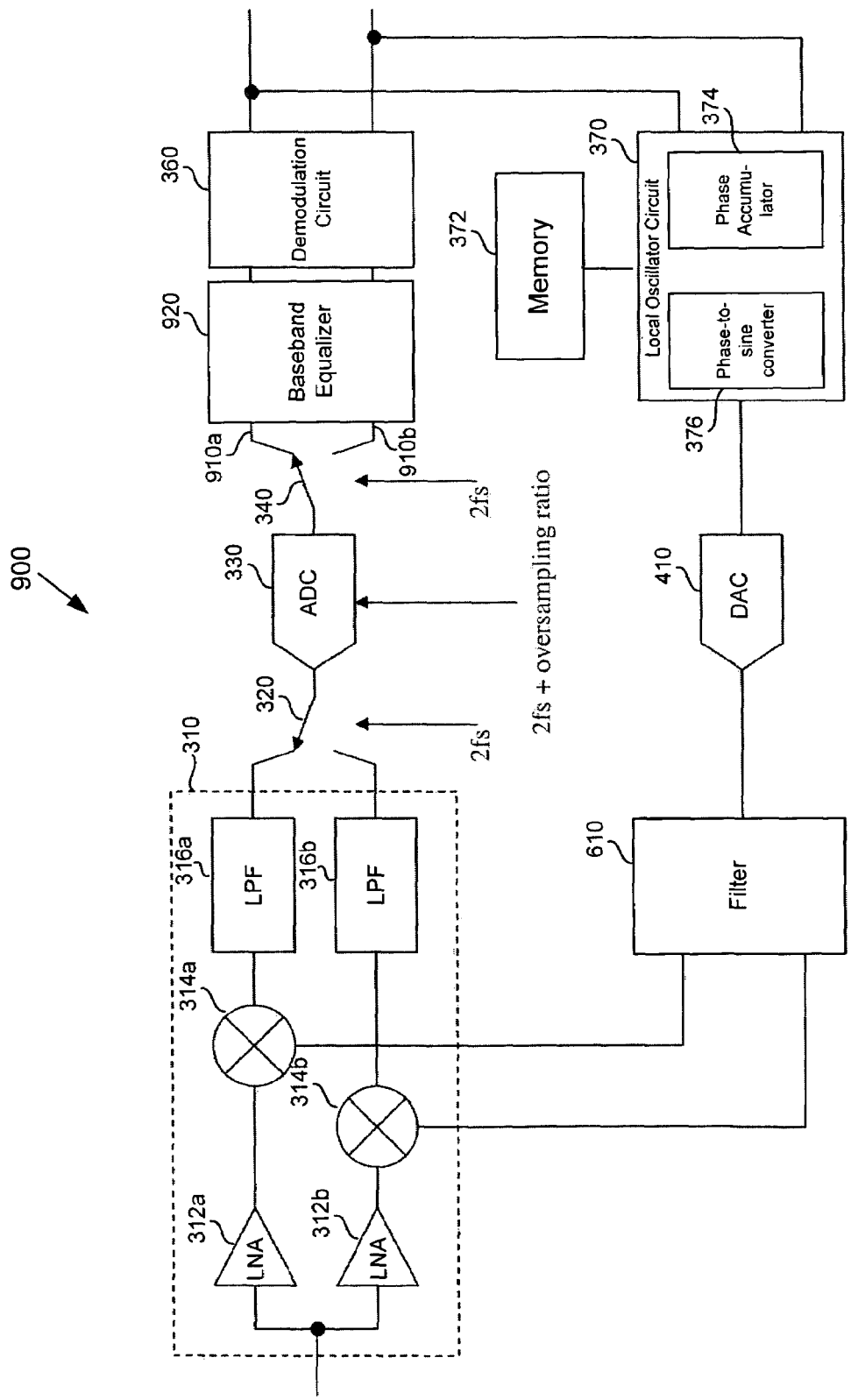
FIG. 9 illustrates a receiver having a baseband equalizer according to an embodiment of the present invention.

FIG. 9 illustrates a receiver having a baseband equalizer according to an embodiment of the present invention. Quadrature paths of the receiver 900 are generally not completely isolated from each other. For instance, a first quadrature component traveling along a first path 910*a* can include information from a second quadrature component traveling along a second path 910*b*, and vice versa. The baseband equalizer 920 can determine how much information from one quadrature component is included in the other quadrature component, and vice versa. The baseband equalizer 920 generally subtracts the second quadrature component information or a portion thereof from the first quadrature component. The baseband equalizer 920 typically subtracts the first quadrature component information or a portion thereof from the second quadrature component.

The baseband equalizer 920 can provide quadrature phase correction of the digitized downconverted signal. For instance, one of the demultiplexed quadrature components received from the demultiplexer 340 can be frequency shifted or phase shifted with respect to the other demultiplexed quadrature component. The baseband equalizer 920 can reduce or eliminate the difference in frequency and/or phase between the demultiplexed quadrature components.

The baseband equalizer 920 generally includes a phase detector and an amplitude detector. The phase detector can detect a difference of phase between quadrature components. The amplitude detector can detect a difference of amplitude between the quadrature components.

Figure 10:
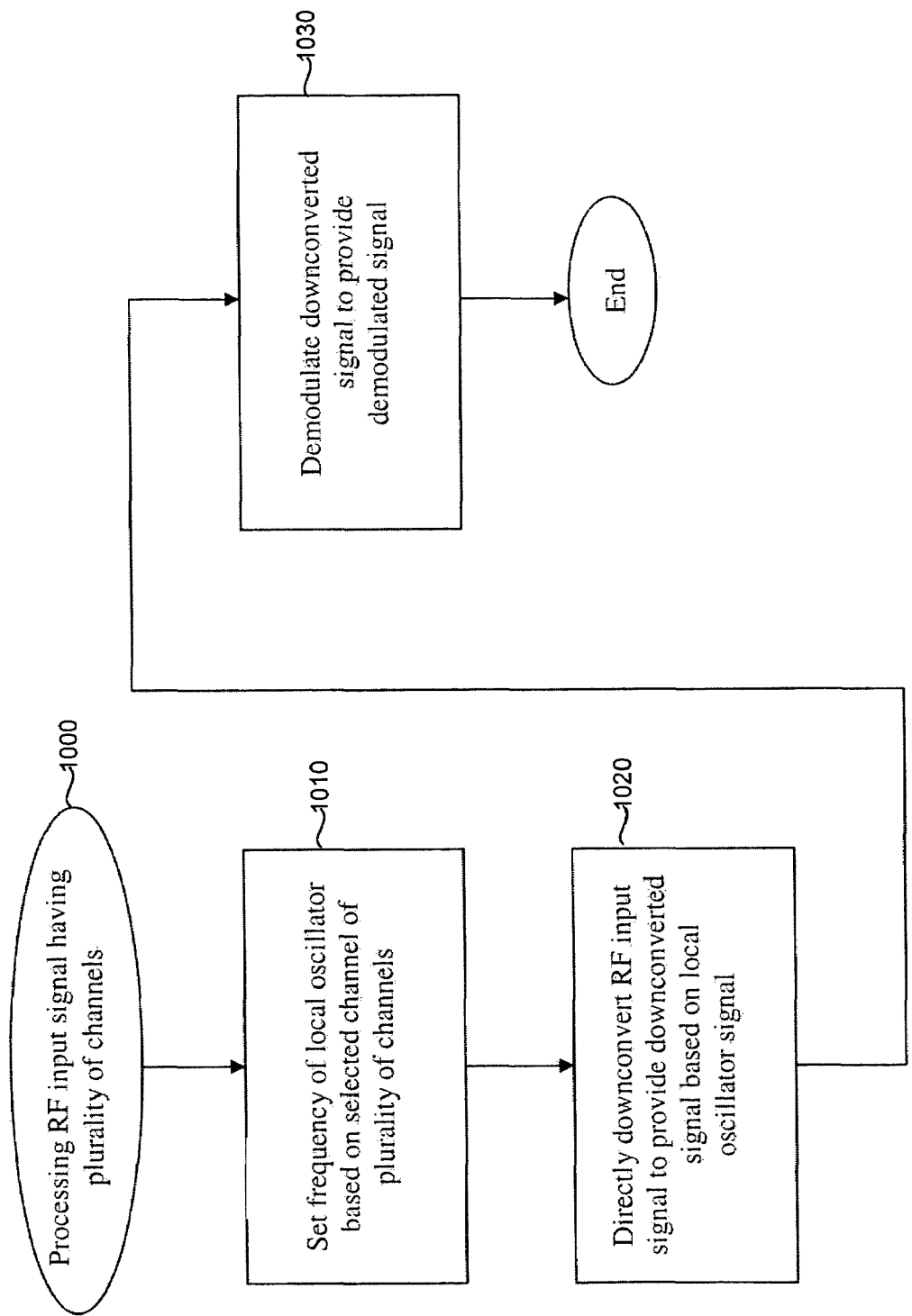
FIG. 10 illustrates a flow chart of a method of processing a RF input signal having a plurality of channels according to an embodiment of the present invention.

FIG. 10 illustrates a flow chart of a method of processing a RF input signal 102 having a plurality of channels according to an embodiment of the present invention. A local oscillator circuit 370 can set the frequency of a local oscillator at block 1010 based on a selected channel of the plurality of channels. For instance, the frequency of the local oscillator can be modified using the channel selector 110 as shown in FIG. 1. A direct down conversion circuit 310 can directly downconvert the RF input signal 102 at block 1020 to provide a downconverted signal based on the local oscillator signal. For example, at least one mixer 314 can mix the local oscillator with the RF input signal 102 to provide the downconverted signal. In an embodiment, information not associated with the selected channel is removed from the downconverted signal. For instance, at least one low pass filter 316 can low pass filter the downconverted signal to remove unwanted harmonics. A demodulation circuit demodulates the downconverted signal at block 1030 to provide a demodulated signal.

Figure 11:
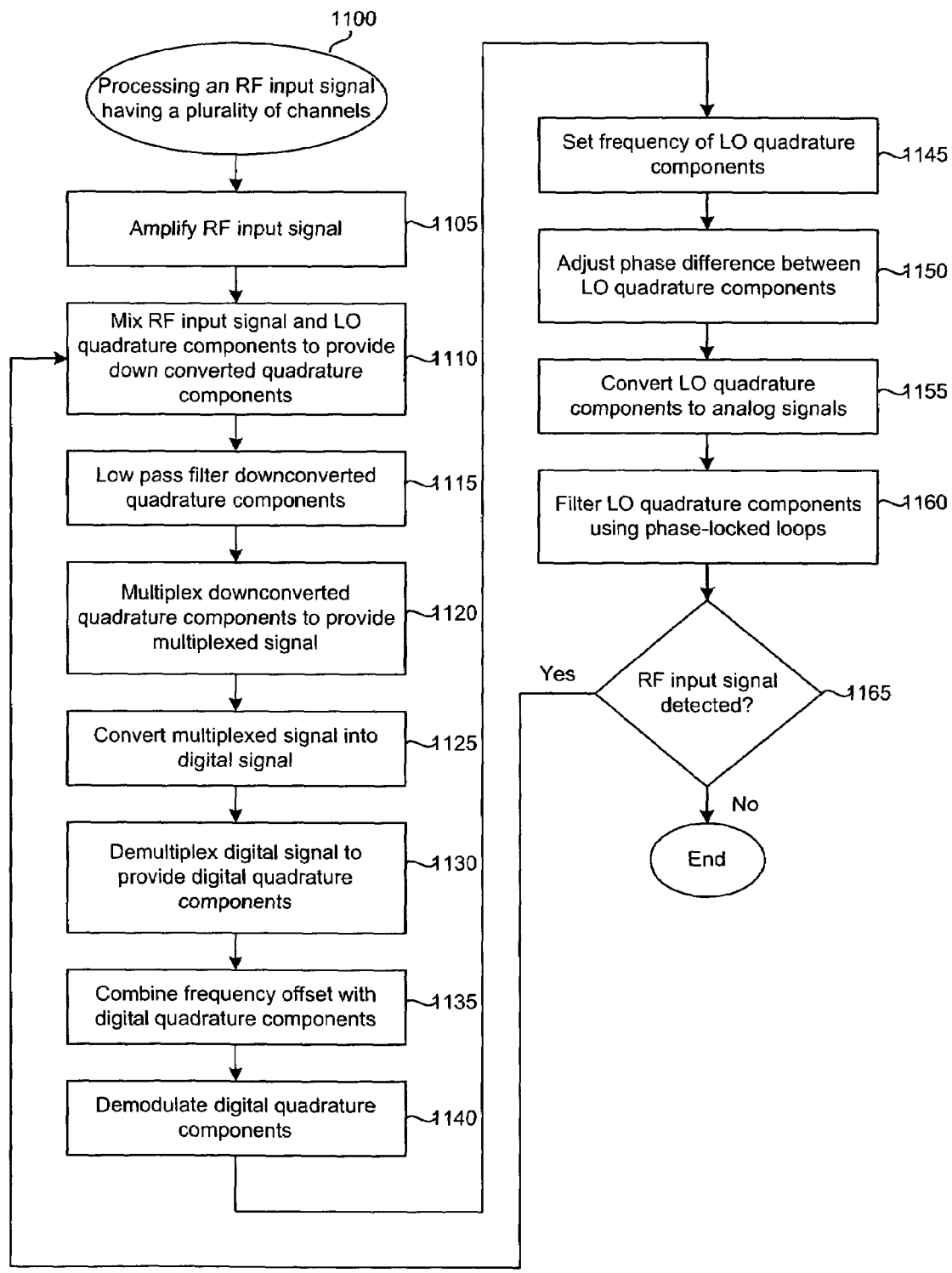
FIG. 11 illustrates a more detailed flow chart of a method of processing a RF input signal having a plurality of channels according to an embodiment of the present invention.

Referring to FIG. 11, a low noise amplifier (LNA) amplifies the RF input signal 102 at block 1105 to ensure that its amplitude is above the noise floor of the receiver 300, 400, or 500. Mixers 314 mix the RF input signal with local oscillator (LO) quadrature components at block 1110 to provide downconverted quadrature components. For example, the direct downconversion circuit 310 can downconvert the RF quadrature components to an IF frequency or to baseband. At least one low pass filter (LPF) filters the downconverted quadrature components at block 1115 to remove unwanted harmonics. A multiplexer 320 can multiplex the downconverted quadrature components at block 1120 at a multiplexing rate of at least twice the frequency of the downconverted quadrature components to provide a multiplexed signal. An analog-to-digital converter (ADC) 330 converts the multiplexed signal at block 1125 into a digital signal, which is demultiplexed at block 1130 by a demultiplexer 340 to provide digital quadrature components. In an embodiment, a demultiplexer 340 demultiplexes the digital signal at the multiplexing rate.

Mixers 350 can combine a frequency offset with the digital quadrature components at block 1135 to center the digital components in the Nyquist filter bandwidth. A demodulation circuit 360 demodulates the digital quadrature components at block 1140, so that they can be provided to a symbol mapper or a forward error correction (FEC) circuit, to provide some examples. A local oscillator circuit 370 can use the demodulated quadrature components to set the frequency of the LO quadrature components at block 1145. In an embodiment, setting the frequency of the local oscillator signal eliminates the need to combine the frequency offset with the digital quadrature components at block 1135.

Mismatches can occur between quadrature components. For example, the phase of one quadrature component can shift with respect to the other quadrature component as the two components travel along their quadrature paths. A mismatch, such as the phase mismatch just described, can be corrected by adjusting the phase difference between the LO quadrature components at block 1150. For example, the local oscillator circuit 370 can set the phase difference between LO quadrature components at a value different than 90° to take into consideration the mismatch. In an embodiment, setting the frequency of the LO quadrature components, as set forth at block 1145, includes adjusting the phase difference between the LO quadrature components, as set forth at block 1150.

Mixers 350 correct imbalances between quadrature components of the downconverted signal before the demodulator 360 demodulates the downconverted signal, according to an embodiment. The local oscillator signal is generally based on the demodulated signal. For instance, the local oscillator signal can be based on a difference between quadrature components of the downconverted signal.

At least one digital-to-analog converter (DAC) 380 converts the LO quadrature components to analog signals at block 1155. A filter 390 can filter the LO quadrature components at block 1160 using at least one phase-locked loop (PLL) 392, for example. The local oscillator circuit 370 generally performs operations using a digital representation of the LO signal, and the filter 390 typically performs operations using the analog LO signal provided by the DAC 380. If a RF input signal is detected, as determined at diamond 1165, processing the RF input signal continues with mixers 314 mixing the LO quadrature components and the RF input signal, as set forth at block 1110. If no RF input signal is detected, processing the RF input signal ends.

Figure 12:
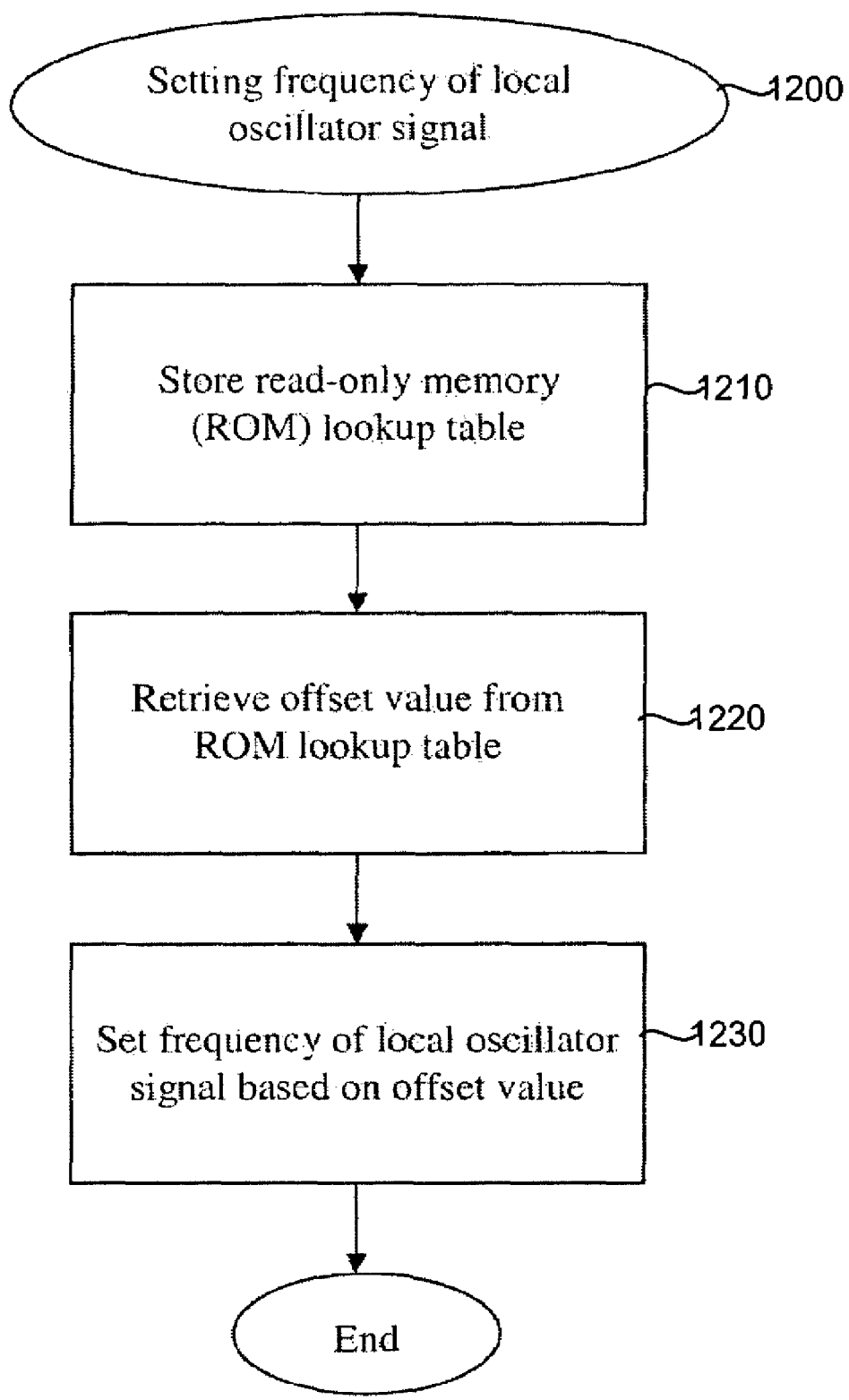
FIG. 12 illustrates a flow chart of a method of setting a frequency of a local oscillator signal according to an embodiment of the present invention.

FIG. 12 illustrates a flow chart of a method of setting a frequency of a local oscillator signal according to an embodiment of the present invention. The local oscillator circuit 370, for example, can read or sample the frequency, phase, or amplitude of the local oscillator signal to determine whether the phase or frequency of the local oscillator signal should be modified. The local oscillator circuit 370 can read or sample characteristics of the local oscillator signal using digital and/or analog representations of the local oscillator signal. For example, the local oscillator circuit 370 can track time-dependent errors in the receiver 300, 400, 500, 600, 700, 800, or 900.

A memory 372 can store the difference between the phase or frequency of the local oscillator signal and the desired phase or frequency. The local oscillator circuit 370 can set the phase or frequency of the local oscillator based on the difference that is stored in memory 372. The memory 372, for example, can store a read-only memory (ROM) lookup table at block 1210. The ROM lookup table can include an offset value. The offset value can be based on a difference between the actual phase or frequency of the local oscillator and a desired phase or frequency of the local oscillator signal. The local oscillator circuit 370, for example, can compare the phase or frequency of the local oscillator signal to the desired phase or frequency to calculate the offset value. The local oscillator circuit 370 can retrieve the offset value from the ROM lookup table at block 1220. At block 1230, the local oscillator circuit 370 sets the frequency of the local oscillator signal based on the offset value.

Figure 13:
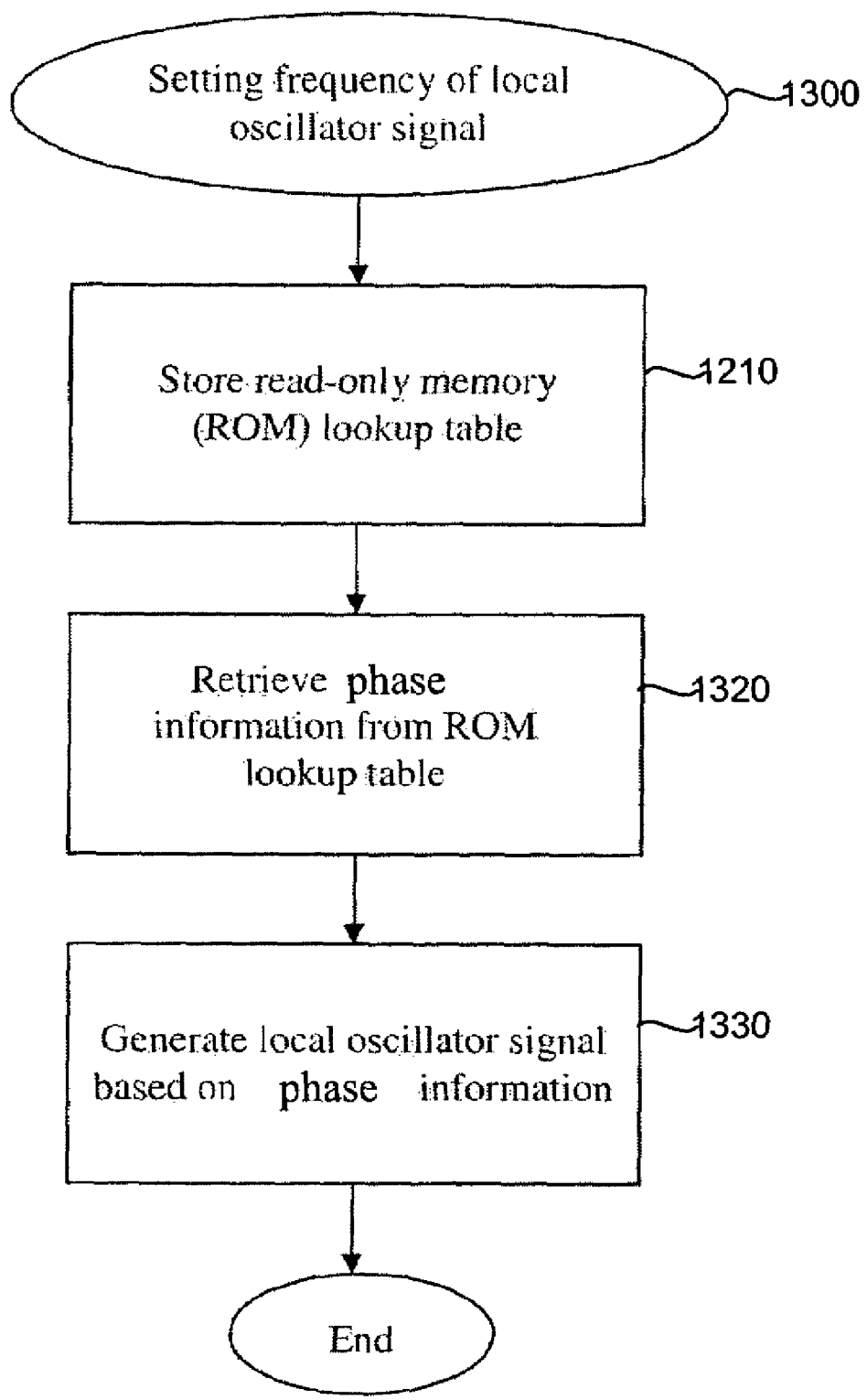
FIG. 13 illustrates a flow chart of another method of setting a frequency of a local oscillator signal according to an embodiment of the present invention.

Referring to FIG. 13, the ROM lookup table can include phase information relating to the local oscillator signal. For example, the phase information can include a plurality of values, with each value representing a desired phase of the local oscillator signal for an associated clock cycle. The local oscillator circuit 370 can retrieve the phase information at block 1320. In an embodiment, the local oscillator circuit 370 retrieves a value at each successive clock cycle. A particular value can be associated with more than one clock cycle. The local oscillator signal is generated at block 1330 based on the phase information. The sine or cosine of the values can be associated with successive clock cycles, such that a discrete or digitized sinusoidal waveform is provided in an embodiment. For instance, the local oscillator circuit 370 can generate a digital representation of the local oscillator signal, and the DAC(s) can convert the digital representation to the analog local oscillator signal.

In an embodiment, the local oscillator circuit 370 combines a phase offset with the value of the phase retrieved from the ROM lookup table. For example, manipulating the phase of the local oscillator signal can account for a phase shift that occurs during processing of the RF input signal. The phase of one quadrature component can shift more or less than the phase of the other quadrature component in some instances. For instance, differences in the quadrature paths can create a phase shift between the quadrature components. The phase difference between LO quadrature components can be adjusted using the phase offset to account for this phase shift between quadrature components. In an embodiment, the local oscillator circuit 370 can use the phase offset to adjust the quadrature between the LO quadrature components to be a value other than 90°.

CONCLUSION

Example embodiments of the methods, systems, and components of the present invention have been described herein. As noted elsewhere, these example embodiments have been described for illustrative purposes only, and are not limiting. Other embodiments are possible and are covered by the invention. Such other embodiments will be apparent to persons skilled in the relevant art(s) based on the teachings contained herein. Thus, the breadth and scope of the present invention should not be limited by any of the above-described exemplary embodiments, but should be defined only in accordance with the following claims and their equivalents.

What is claimed is:

1. A receiver to process a RF input signal having a plurality of channels, the receiver comprising:
   a direct down conversion circuit to provide a downconverted signal based on the RF input signal and a local oscillator signal;
   means for digitizing the downconverted signal;

a digital demodulation circuit to receive the digitized downconverted signal and to provide a demodulated signal;

a local oscillator circuit to set a frequency of the local oscillator signal based on a selected channel of the plurality of channels, wherein the direct down conversion circuit, the digital demodulation circuit, and the local oscillator circuit are on a common substrate;

a memory to store an offset value, wherein the frequency of the local oscillator is further based on the offset value; and a phase-locked loop (PLL) to filter and multiply the local oscillator signal received from the local oscillator circuit.

2. The receiver of claim 1, further including a divider to divide the frequency of the local oscillator signal by a factor.

3. The receiver of claim 1, wherein the downconverted signal includes a first quadrature component and a second quadrature component.

4. The receiver of claim 3, wherein the local oscillator circuit is configured to reduce a gain mismatch, a frequency mismatch, or a phase mismatch between the first quadrature component and the second quadrature component.

5. The receiver of claim 3, further including a baseband equalizer to reduce a gain mismatch, a frequency mismatch, or a phase mismatch between the first quadrature component and the second quadrature component.

6. The receiver of claim 1, further including:
a digital-to-analog converter (DAC) coupled to the local oscillator circuit to provide a reference signal; and
an oscillator coupled to the PLL to provide a first LO quadrature component and a second LO quadrature component of the local oscillator signal to the direct down conversion circuit, wherein the phase-locked loop provides the local oscillator signal based on the reference signal.

7. The receiver of claim 6, wherein the oscillator is a ring oscillator.

8. The receiver of claim 6, further including a divider circuit coupled between the oscillator and the direct down conversion circuit to modify the frequency of the first and second LO quadrature components.

9. The receiver of claim 1, wherein the phase locked loop increases a frequency of the local oscillator signal by a factor.

10. The receiver of claim 1, wherein the local oscillator circuit digitally generates the local oscillator signal.

11. The receiver of claim 1, wherein the local oscillator signal includes a first LO quadrature component and a second LO quadrature component, and the local oscillator circuit independently generates the first LO quadrature component and the second LO quadrature component.

12. The receiver of claim 1, wherein the local oscillator circuit is a direct digital frequency synthesizer.

13. A receiver to process a RF input signal having a plurality of channels, the receiver comprising:
a local oscillator circuit to digitally generate a local oscillator signal;
a phase-locked loop (PLL) to filter and multiply the local oscillator signal received from the local oscillator circuit;
a direct down conversion circuit to mix the local oscillator signal and the RF input signal to provide a downconverted signal; and
a demodulation circuit to receive the downconverted signal;
wherein the local oscillator signal includes a first LO quadrature component and a second LO quadrature component and the local oscillator circuit independently generates the first LO quadrature component and the second LO quadrature component.

14. The receiver of claim 13, further including a divider to divide a frequency of the local oscillator signal by a factor.

15. The receiver of claim 13, wherein the downconverted signal includes a first quadrature component and a second quadrature component.

16. The receiver of claim 15, wherein the direct down conversion circuit includes a first mixer to provide the first quadrature component and a second mixer to provide the second quadrature component.

17. The receiver of claim 15, further including a means for switching between the first quadrature component and the second quadrature component, and the direct down conversion circuit further includes an analog-to-digital converter to convert the first quadrature component and the second quadrature component to digital signals.

18. The receiver of claim 15, wherein the local oscillator circuit is configured to reduce a gain mismatch, a frequency mismatch, or a phase mismatch between the first quadrature component and the second quadrature component.

19. The receiver of claim 15, further including a baseband equalizer to reduce a gain mismatch, a frequency mismatch, or a phase mismatch between the first quadrature component and the second quadrature component.

20. The receiver of claim 13, further including
a digital-to-analog converter coupled to the local oscillator circuit to provide a reference signal; and
an oscillator coupled to the PLL to provide a first LO quadrature component and a second LO quadrature component of the local oscillator signal to the direct down conversion circuit, wherein the phase-locked loop provides the local oscillator signal based on the reference signal.

21. The receiver of claim 20, wherein the oscillator is a ring oscillator.

22. The receiver of claim 20, further including a divider circuit coupled between the oscillator and the direct down conversion circuit to modify a frequency of the first and second LO quadrature components.

23. The receiver of claim 13, wherein the phase locked loop increases a frequency of the local oscillator signal by a factor.

24. The receiver of claim 13, wherein the local oscillator circuit is a direct digital frequency synthesizer.

25. The receiver of claim 13, further including a memory to store an offset value, and a frequency of the local oscillator is based on the offset value.

26. A receiver to process a RF input signal having a plurality of channels, the receiver comprising:
a local oscillator circuit to digitally generate a local oscillator signal;
a phase-locked loop (PLL) to filter and multiply the local oscillator signal received from the local oscillator circuit;
a direct down conversion circuit to mix the local oscillator signal and the RF input signal to provide a downconverted signal;
a demodulation circuit to receive the downconverted signal; and
a baseband equalizer to reduce one of a gain mismatch, a frequency mismatch, or a phase mismatch between a first quadrature component and a second quadrature component of the downconverted signal.

* * * * *

UNITED STATES PATENT AND TRADEMARK OFFICE
CERTIFICATE OF CORRECTION

| | | |
|---|---|---|
| PATENT NO. | : 7,535,976 B2 | Page 1 of 1 |
| APPLICATION NO. | : 10/902477 | |
| DATED | : May 19, 2009 | |
| INVENTOR(S) | : Steven Jaffe | |

It is certified that error appears in the above-identified patent and that said Letters Patent is hereby corrected as shown below:

Title page
Item (12), please replace "Jaffee et al." with --Jaffe et al.--.

Title page
Item (75), please replace "Steven Jaffee," with --Steven Jaffe,--.

Column 14
Line 1, please replace "component" with --component,--.

Signed and Sealed this

Fourteenth Day of September, 2010

David J. Kappos
*Director of the United States Patent and Trademark Office*